US 6,567,965 B2

(12) United States Patent
Sakagami et al.

(10) Patent No.: US 6,567,965 B2
(45) Date of Patent: May 20, 2003

(54) ELECTRONIC PARTS PLACEMENT METHOD AND A COMPUTER READABLE MEDIUM HAVING AN ELECTRONIC PARTS PLACEMENT PROGRAM

(75) Inventors: Tomonari Sakagami, Hadano (JP); Masato Mogaki, Hadano (JP); Ikutane Miyamaru, Ebina (JP)

(73) Assignee: Hitachi, Ltd., Tokyo (JP)

( * ) Notice: Subject to any disclaimer, the term of this patent is extended or adjusted under 35 U.S.C. 154(b) by 158 days.

(21) Appl. No.: 09/725,126

(22) Filed: Nov. 29, 2000

(65) Prior Publication Data

US 2001/0007145 A1 Jul. 5, 2001

(30) Foreign Application Priority Data

Dec. 2, 1999 (JP) .......................................... 11-343243

(51) Int. Cl.[7] ............................................... G06F 17/50
(52) U.S. Cl. .................................. 716/10; 716/8; 716/9; 716/12
(58) Field of Search ........................................ 716/1–21

(56) References Cited

U.S. PATENT DOCUMENTS

| | | | | |
|---|---|---|---|---|
| 5,168,455 A | * | 12/1992 | Hooper | 716/18 |
| 5,754,444 A | * | 5/1998 | Koford | 716/8 |
| 5,870,309 A | * | 2/1999 | Lawman | 716/6 |
| 5,930,147 A | * | 7/1999 | Takei | 716/12 |
| 5,974,245 A | * | 10/1999 | Li et al. | 716/10 |
| 6,233,724 B1 | * | 5/2001 | LaBerge | 716/18 |
| 6,367,056 B1 | * | 4/2002 | Lee | 716/5 |

FOREIGN PATENT DOCUMENTS

JP   8-305745   11/1996

OTHER PUBLICATIONS

M. Sarrafzadeh, et al "A Delay Budgeting Algorithm Ensuring Maximum Flexibility in Placement", IEEE Transactions on Computer–Aided Design of Integrated Circuits and Systems, vol. 16, No. 11, Nov. 1997 pp 1332–1341.*
Tellez et al "A Performance–Driven Placement Technique Based on a New Budgeting Criterion", IEEE, 1996, pp 504–507.*
"Skew–Reduction Method in VLSI Design", IBM Technical Disclosure Bulletin, Jul. 1993, vol. 36, No. 7, pp 413–414.*

* cited by examiner

Primary Examiner—Matthew Smith
Assistant Examiner—Magid Y Dimyan
(74) Attorney, Agent, or Firm—Mattingly, Stanger & Malur, P.C.

(57) ABSTRACT

When gates are placed on a chip, an average delay budget per stage of the gate is calculated from a target machine cycle time and the number of logic gate stages between an initial point flip-flop and a terminal point flip-flop, a wire length limitation of a net of each stage is calculated from the average delay budget and delay characteristics of the gate of each stage, and the gates are placed by using the wire length limitation as a target function.

15 Claims, 6 Drawing Sheets

ELECTRONIC PARTS PLACEMENT METHOD AND A COMPUTER READABLE MEDIUM HAVING AN ELECTRONIC PARTS PLACEMENT PROGRAM

BACKGROUND OF THE INVENTION

The invention relates to a method of placing electronic parts in consideration of a delay in layout of a semiconductor integrated circuit.

Hitherto, in a placement process in a layout design of a semiconductor integrated circuit, the placement process has been performed by setting a function for minimizing the total of virtual wire lengths to a target function. As a conventional technique regarding a layout method of the semiconductor integrated circuit, for example, the technique disclosed in JP-A-8-305745 has been known. According to such a conventional technique, an area where gates are placed is divided into a plurality of portions and when an assignment of the gate to each divided area is decided, a function to minimize a wire length between terminals belonging to each gate is used as a target function, an assignment problem of the gates is converted into a regular formula as a linear programming problem, and the optimum assignment of the gates is determined by using an integer programming method.

According to the above conventional technique, a path delay is not always minimized due to a difference of delay characteristics of the gates. The path delay used here denotes a delay which is caused from an initial point flip-flop to a position before a terminal point flip-flop.

SUMMARY OF THE INVENTION

It is an object of the invention to provide a method of placing electronic parts so as to set a path delay to a more proper delay in consideration of the problems in the conventional technique.

According to the invention, the above object is accomplished by a method whereby a delay budget per stage of the gate is calculated from a target machine cycle time and the number of logic stages in a path, a wire length limitation of a net of each stage is calculated from the delay budget and delay characteristics of the gate of each stage, and the wire length limitation is used as a target function of placement.

DESCRIPTION OF THE EMBODIMENTS

An embodiment of the invention will now be described in detail bellow with reference to the drawings.

Figure 1A:
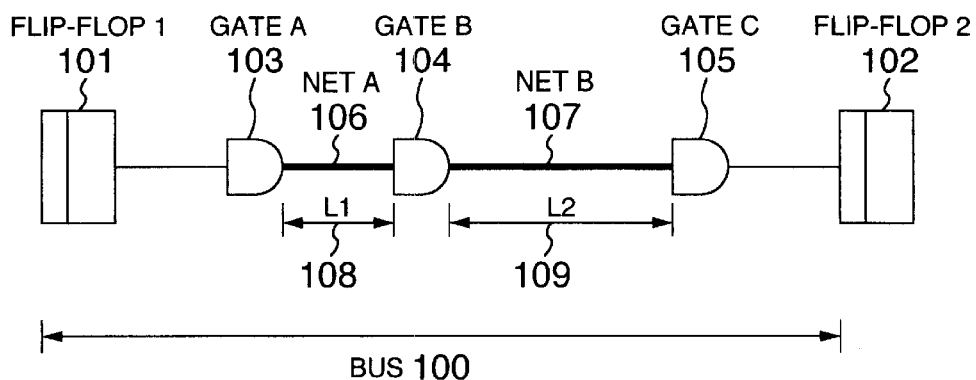
FIGS. 1A and 1B are diagrams for explaining a problem to be solved by the invention.
Figure 1B:
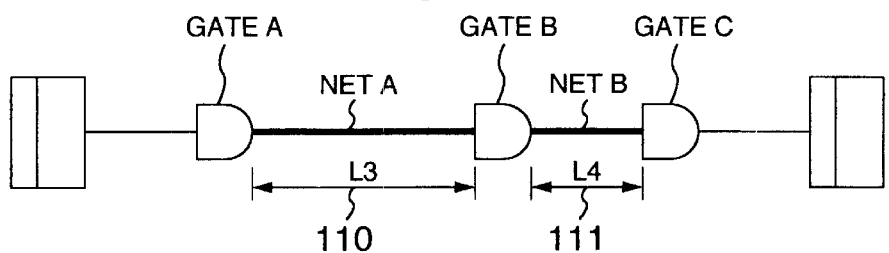

FIG. 1 shows an example of a construction of a path 100. In FIG. 1, reference numerals 101 and 102 denote flip-flops; 103, 104, and 105 gates as electronic parts; 106 and 107 nets; and 108, 109, 110, and 111 wire lengths of the nets. Although the elements constructing the paths shown in FIGS. 1A and 1B are the same, positions of the gates B, the wire lengths of the nets A, and the wire lengths of the nets B are different. A wire length L1 of the net A in FIG. 1A and a wire length L4 of the net B in FIG. 1B are the same (L1=L4). A wire length L2 of the net B in FIG. 1A and a wire length L3 of the net A in FIG. 1B are the same (L2=L3).

Figure 2:
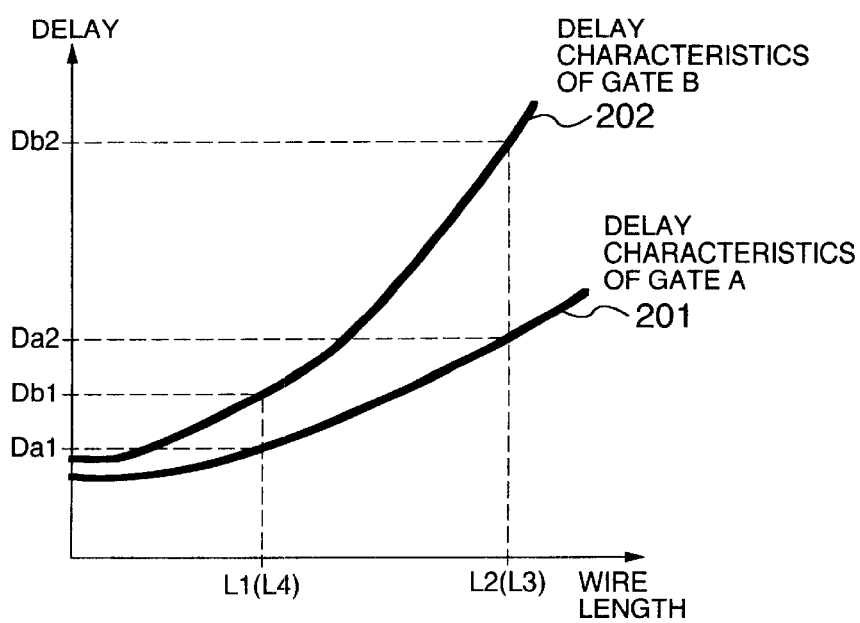
FIG. 2 is a diagram showing an example of delay characteristics of gates.

FIG. 2 shows an example of delay characteristics of the gates A and B shown in FIG. 1. In FIG. 2, reference numeral 201 denotes delay characteristics of the gate A and 202 indicates delay characteristics of the gate B. As shown here, the delay characteristics for the wire lengths differ depending on the kind of gate. When seeing the delay characteristics of the gate A, an initial value, namely, a value at the time of the zero wire length is an element delay of the gate A itself. The longer the wire length is, the larger the delay is. When seeing the delay characteristics of the gate B, an initial value is an element delay of the gate B itself. Similarly, as the wire length becomes longer after that, the delay increases more. However, when comparing them, the characteristics of the delay of the gate B are steeper. This phenomenon depends on the characteristics of the element itself and it is because a driving force of a signal, namely, a force of extruding the signal differs in dependence on the element. Such characteristics differ every element and have been known. From the graph of FIG. 2, the delay can be recognized from the wire length and, contrarily, the wire length can be recognized from the delay.

Virtual wire lengths between the gates A and C in both of FIGS. 1A and 1B are the same (L1+L2=L3+L4). However, when the delay between the gates A and C is calculated from the delay characteristics of the gate, it is equal to Da1+Db2 in case of FIG. 1A and Da2+Db1 in case of FIG. 1B. A phenomenon such that the delay in case of the path in FIG. 1A is larger than that in FIG. 1B occurs. That is, even if the wire length is minimized, it does not always give a reduction of the delay.

It is necessary to cope with the recent increase in the processing speed of an information processing equipment.

An embodiment of a placement deciding method according to the invention will now be described in detail hereinbelow with reference to FIGS. 3 to 8.

Figure 3:
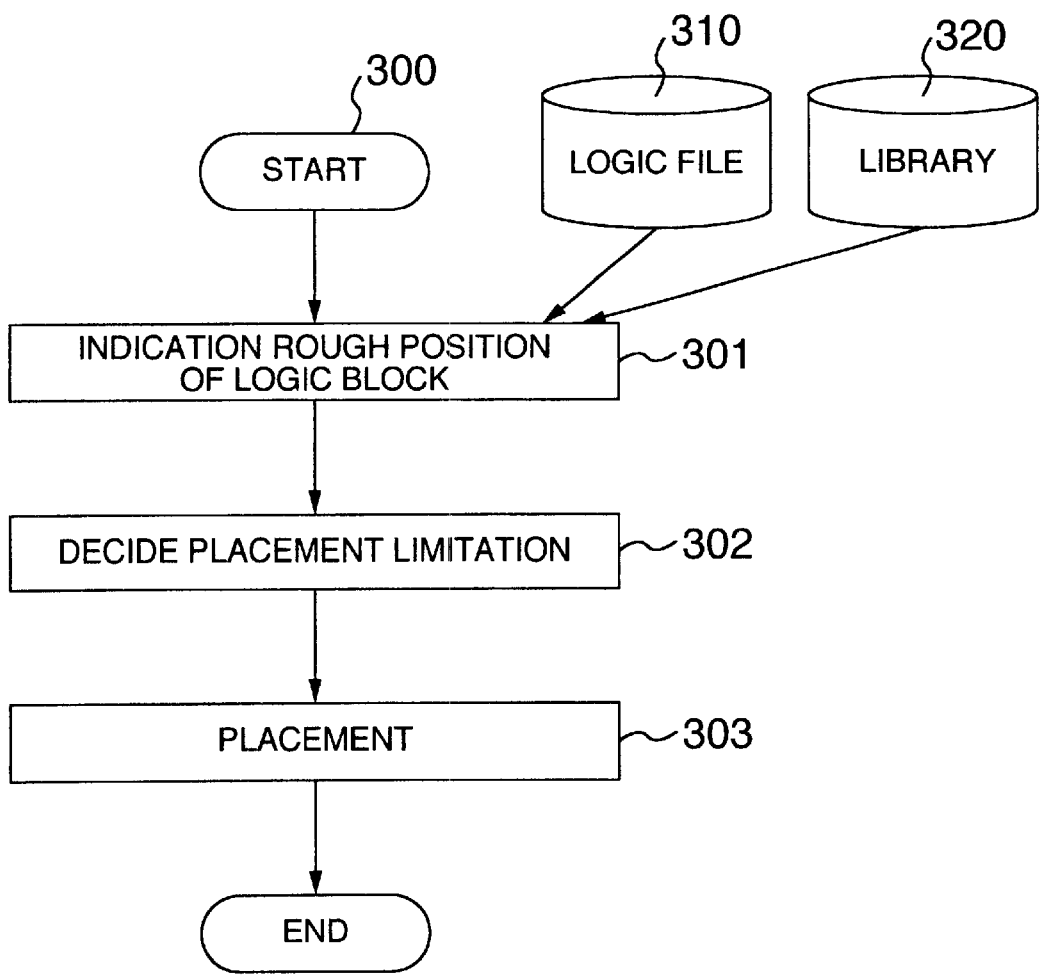
FIG. 3 is a flowchart for explaining a processing flow from an indication of a rough position of a logic block to a placement of chips according to an embodiment of the invention.
Figure 4:
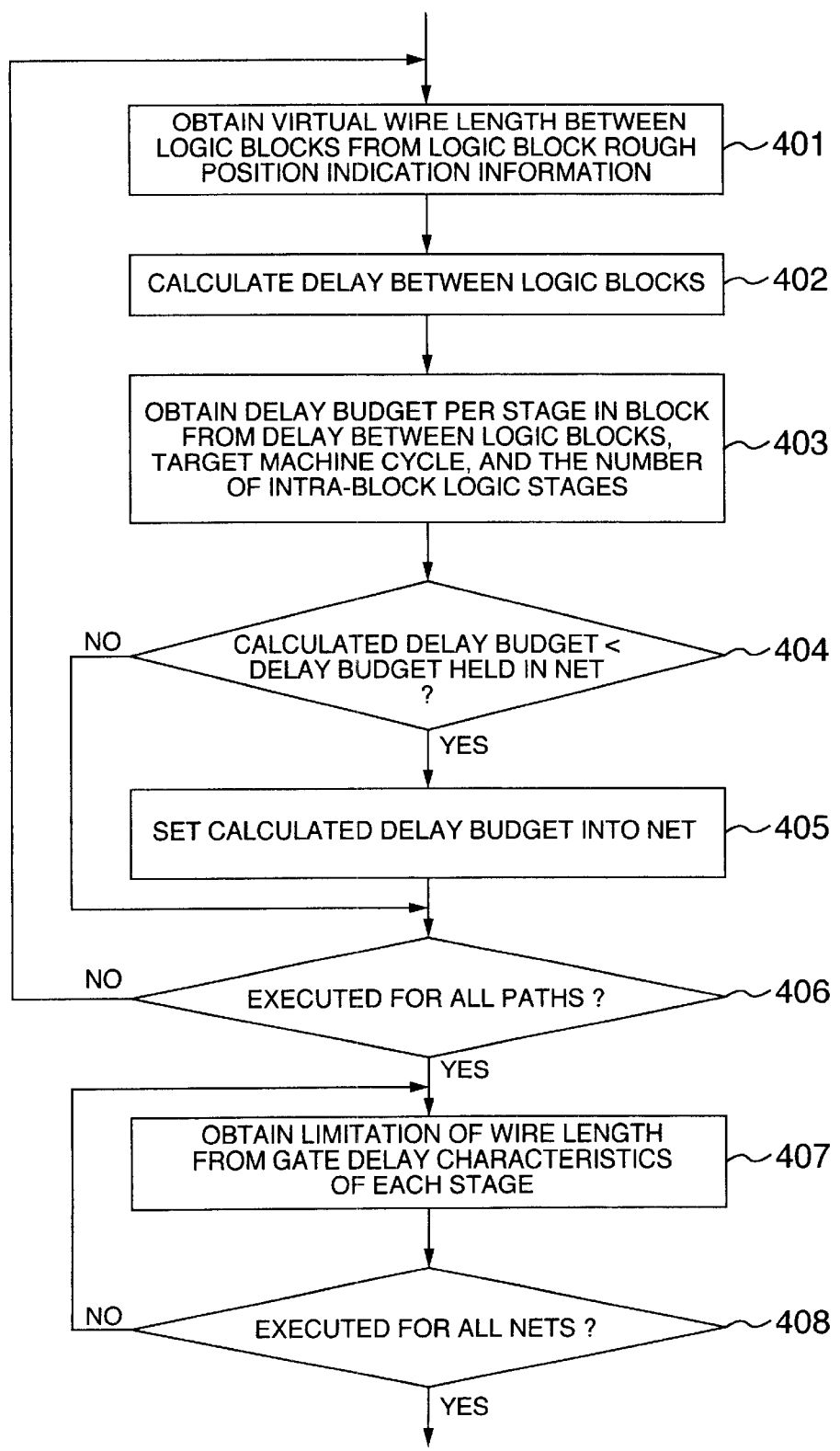
FIG. 4 is a flowchart for explaining the processing operation of a method of deciding a placement criteria according to the embodiment of the invention.
Figure 5:
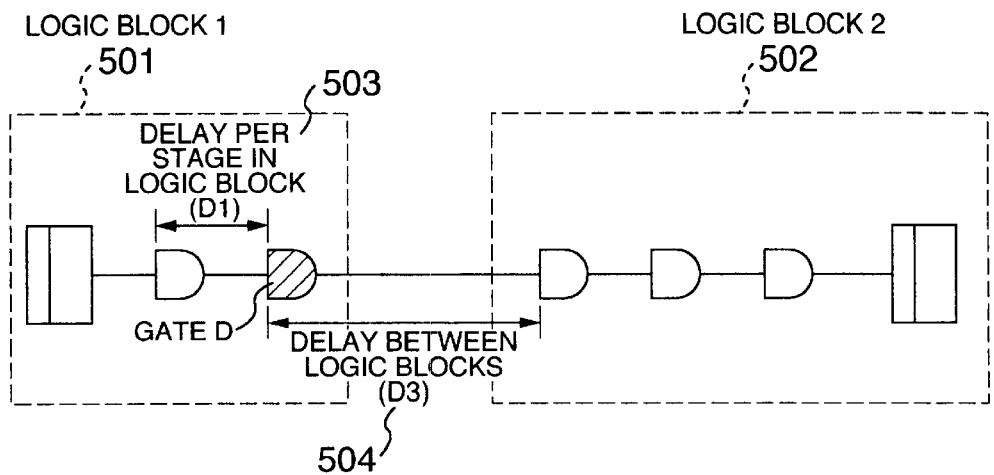
FIG. 5 is a diagram for explaining a construction of a path as a processing target in the embodiment of the invention.
Figure 6:
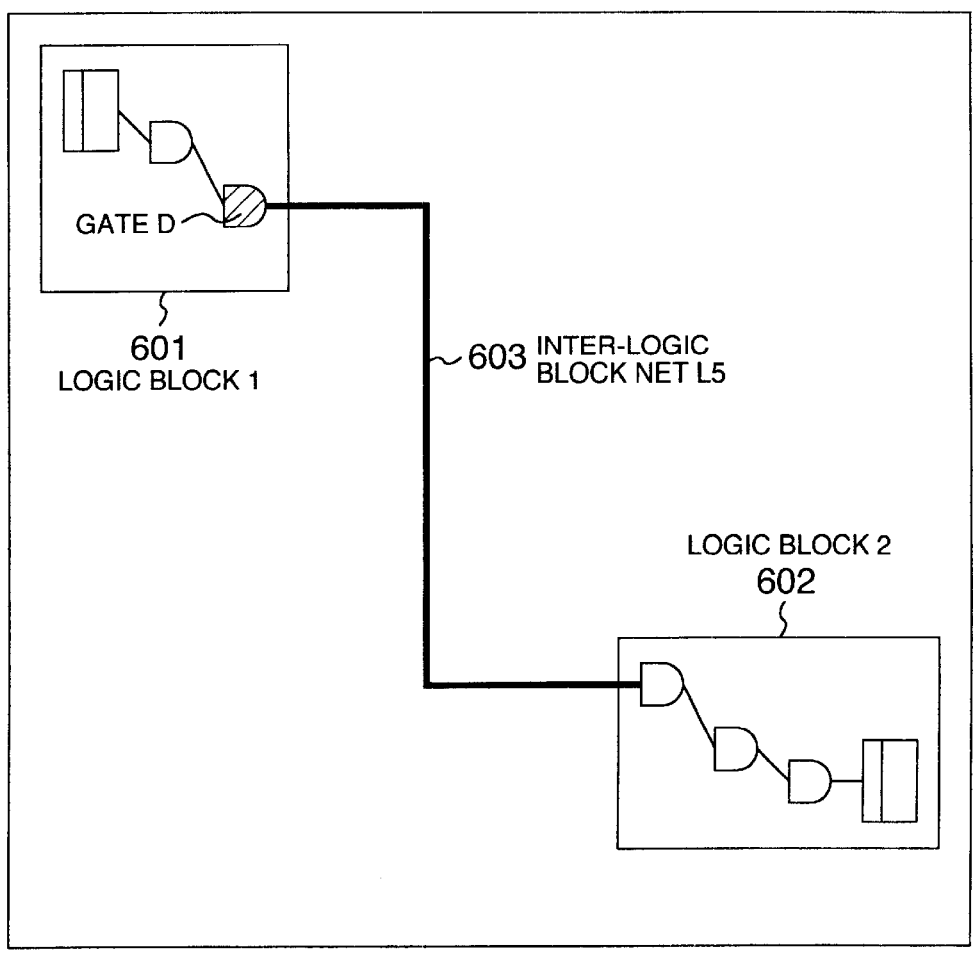
FIG. 6 is a diagram for explaining a calculation of a virtual wire length of an inter-logic block net.
Figure 7:
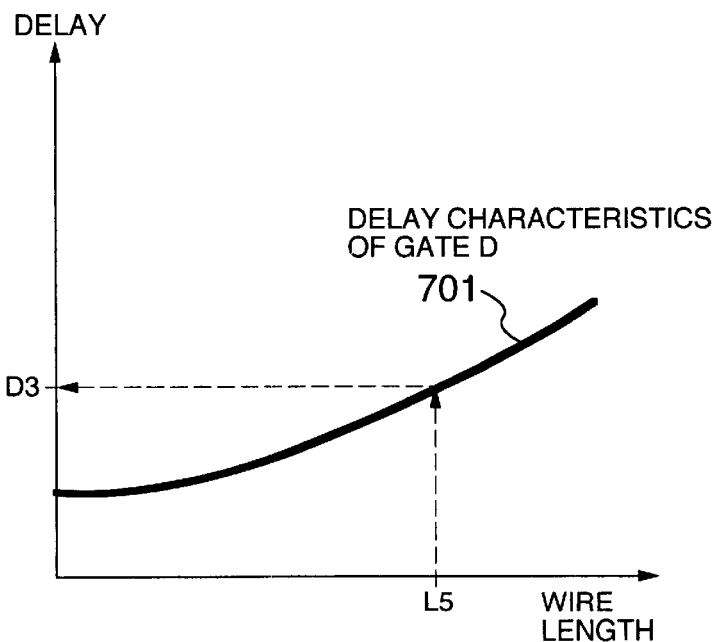
FIG. 7 is a diagram for explaining a calculation of a delay between the logic blocks.
Figure 8:
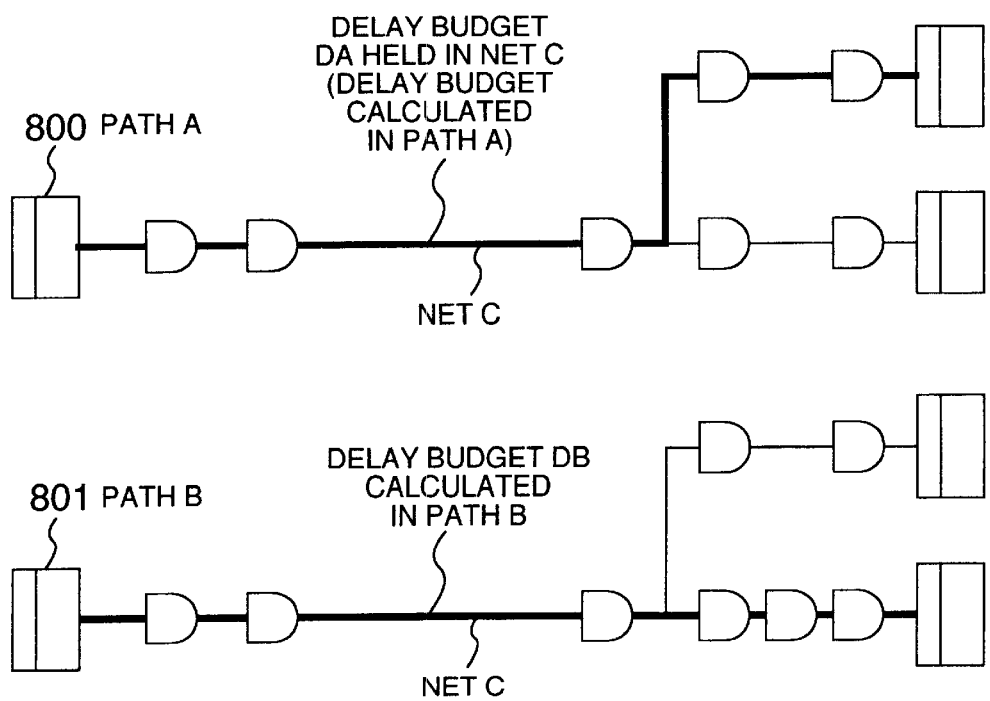
FIG. 8 is a diagram for explaining a process for setting a delay budget of the net.

FIGS. 3 and 4 are flowcharts for explaining the processing operation of the placement deciding method according to the embodiment of the invention. FIG. 5 is a diagram for explaining an example of a path as a processing target. FIG. 6 is a diagram for explaining a calculation of a virtual wire length of an inter-logic block net. FIG. 7 is a diagram for explaining a calculation of a delay of the inter-logic block net. FIG. 8 is a diagram for explaining a calculation of a delay budget of the net of each stage.

First, processes according to the embodiment of the invention will be described with reference to processing flows shown in FIGS. 3 and 4. An outline of a whole processing flow from an indication of a rough position of the logic block to a placement of chips will be described with reference to FIG. 3.

A logic expression (elements and connection of elements) has been stored in a logic file 310. Characteristics of each element which can be used have been stored in a library 320 in order to realize the logic by a combination of the elements. First, after the contents in the logic file 310 and library 320 were inputted, a rough position of logic block is indicated (step 301). The rough position indication denotes that an LSI is divided every plurality of functions (logic blocks) and a rough mutual positional relation is empirically determined so that the divided logic blocks can be easily enclosed. For example, the blocks in each of which the number of wirings between blocks is large are placed to the neighboring positions, or the like.

A placement criteria of the elements is subsequently determined with reference to the result of the indication of the rough position of the logic blocks and the library (step 302). Detailed explanation will be made hereinlater with reference to FIG. 4. A placement process is subsequently executed while conforming to the placement criteria (step 303). Since it can be realized by using an existing algorithm, its description is omitted here.

The placement criteria deciding method in step 302 will now be described with reference to FIG. 4.

First, FIG. 5 shows an example of a path as a processing target and its construction will be described.

The path of FIG. 5 is constructed by two flip-flops, five gates, and six nets (intra-logic block net (namely, net within the logic block): 5 nets, inter-logic block net (namely, net over the logic blocks): 1 net) connecting each elements. A logic block 1 shown at 501 includes one flip-flop, two gates, and two intra-logic block nets. A logic block 2 shown at 502 includes one flip-flop, three gates, and three intra-logic block nets. D1 denotes an average delay budget per stage in the logic block. D3 indicates a delay between the logic blocks.

A flow for the placement criteria deciding method in FIG. 4 will now be described with respect to the example of the path as a processing target in FIG. 5.

First, a virtual wire length between the logic blocks is obtained from the rough position indication information of the logic block (step 401).

The wire length between the logic blocks will now be described with reference to FIG. 6. A length of an inter-logic block net 603 connecting the logic block 1 shown at 601 and the logic block 2 shown at 602 in FIG. 6 is assumed to be L5. Placing positions of the elements (flip-flop, gate) constructing the path are not determined because a placement process is not performed, so that a distance between the logic blocks cannot be obtained. Therefore, both ends of the inter-logic block net 603 are first determined. As a method of deciding both ends of the inter-logic block net 603, for example, there is a method whereby the center point of the respective logic blocks are assumed to be both ends of the inter-logic block net in order to simplify the problem. However, another method can be also used. The virtual wire length L5 between the two points obtained as mentioned above is subsequently derived. Although, for example, a steiner tree method can be used as a method of calculating the virtual wire length, another method can be also used.

The delay between the logic blocks is subsequently calculated (402).

FIG. 7 shows an example of the delay characteristics of the gate D in FIGS. 5 and 6. The delay characteristics are calculated from the library 320 in FIG. 3. The delay of the gate D is obtained from the delay characteristics of the gate D and the virtual wire length L5 of the inter-logic block net obtained in step 401 and set to the delay D3 between the blocks. When a plurality of inter-logic block nets exist serially, the above process is repeated the number of times as many as the number of inter-logic block nets and the sum of the delay is set to a delay between the blocks of the path.

An average delay budget per stage in the logic block is calculated on the basis of the delay between the blocks, the target machine cycle time, and the number of intra-block logic stages of the path (403). Din is obtained by the following equation.

$$Din=(Tm-Db)/n$$

where,
Db: delay between the blocks
Tm: target machine cycle time
n: the number of intra-block logic stages
Din: average delay budget per stage in the logic block The average delay budget Din per stage in the logic block in the path in FIG. 5 is obtained by $$Din=(Tm-D3)/5$$

by substituting each value into the above equation, namely, the delay Db between the blocks calculated in step 402 is set to (Db=D3), the target machine cycle time is set to Tm, and the number (n) of intra-block logic stages of the path shown in FIG. 5 is set to (n=5). The average delay budget per stage in the logic block in this example is assumed to be D4.

It is pointed out that when the obtained average delay budget per stage in the logic block is equal to or less than a reference value, it is impossible to achieve the target machine cycle in this logic. For example, when the obtained average delay budget per stage in the logic block is equal to or less than a gate delay (point where the delay characteristics and a y axis cross) of the gate in the delay characteristics in FIG. 2, even if the gate of this path is arbitrarily placed, this logic never achieve the target machine cycle and a defective logic at the prestage of the placement process is pointed out and can be feedback to the logic design.

Whether the average delay budget calculated in step 403 is smaller than the delay budget which has already been obtained by the calculation in another path and held in the net or not is discriminated (404). If it is smaller, the calculated average delay budget is set as a delay budget of the net (405). If it is larger, the process in step 405 is skipped and the processing routine advances to the next step. This process is provided in consideration of the case where the net is branched and will be specifically explained in FIG. 8.

In FIG. 8, a net C is included in both of paths A and B. First, the average delay budget calculated in the path A is set to DA and used as a delay budget held in the net C. Subsequently, assuming that the average delay budget calculated in the path B is set to DB, DA>DB in FIG. 8. DB is set as a delay budget held in the net C. If DA<DB, DA is used as a delay budget held in the net C as it is and the process in step 405 is executed.

Whether the processes in steps 401 to 405 have been executed with respect to all of the paths or not is discriminated (406). If NO, the above processes are repeated to the unprocessed path. If YES, a process in step 407 is executed. In step 407, a limitation of the wire length is obtained from the gate delay characteristics of each stage and set for the next process. It will be explained hereinbelow with reference to FIG. 9.

Figure 9:
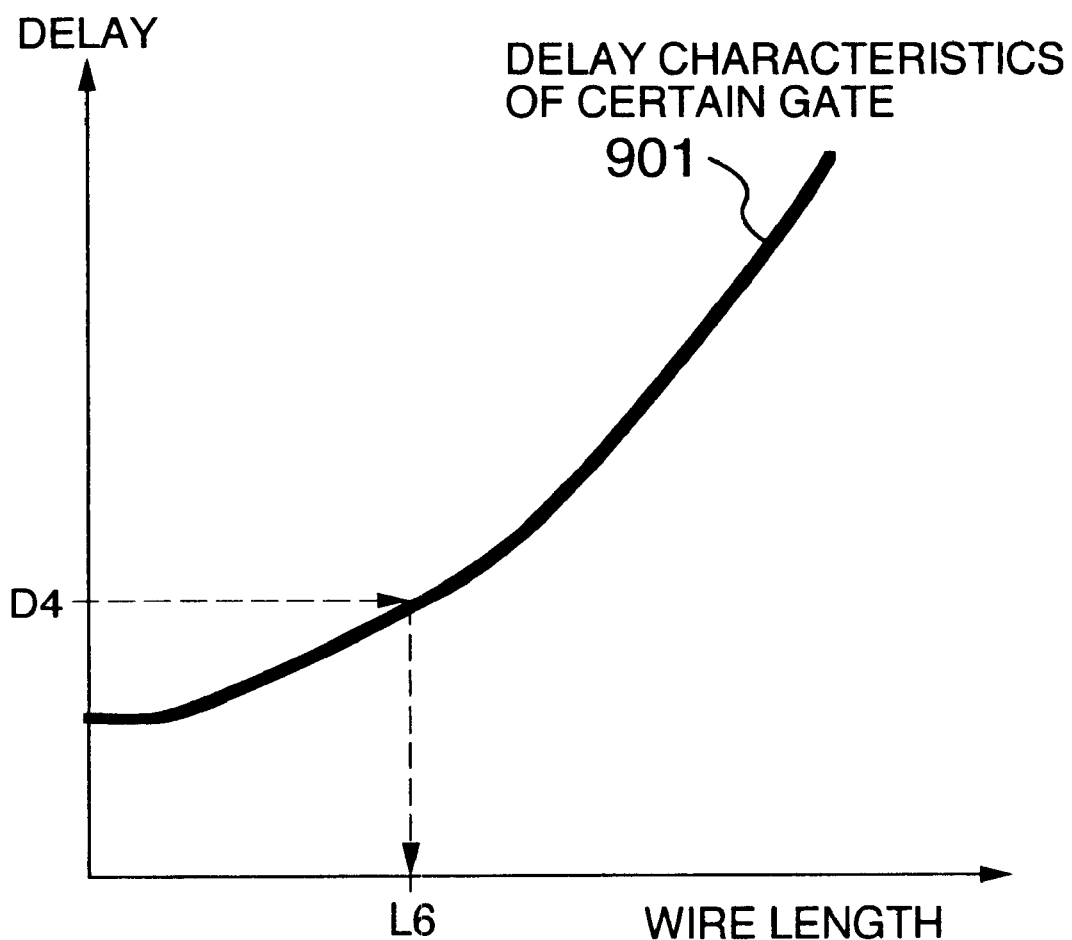
FIG. 9 is a diagram for explaining a calculation of the wire length limitation of the net.

FIG. 9 shows an example of a certain gate delay characteristics. The delay characteristics are calculated from the library 320 in FIG. 3. The delay budget of the net using this gate as a source which has been calculated in the above step is assumed to be D4. The wire length in the case where the delay is set to the delay D4 is calculated from the delay characteristics in FIG. 9 and the delay budget D4 of the net, thereby obtaining a wire length L6. L6 is used as a wire length limitation of the net and set into the net. That is, the delay budget is obtained and the wire length which is permitted every net is obtained therefrom.

Whether the process in step 407 has been executed with respect to all nets or not is subsequently discriminated (408). If NO, the process in step 407 is executed to the unprocessed net. If YES, the placement process 303 in FIG. 3 is executed.

Thus, the wire length limitation obtained in consideration of the delay is assigned to all of the nets on a chip 600. By performing the placement process while keeping this limitation, all of the gates on the chip can be placed so as to satisfy the target machine cycle time.

As described above, according to the invention, the element placement in which the delay is set to a proper value can be performed while realizing the target machine cycle time.

What is claimed is:

1. A placement method of electronic parts for placing gates onto a chip, comprising the steps of:
    calculating an average delay budget per stage of the gate which satisfies a target machine cycle time from the number of gate stages of a path; and
    placing said gates onto the chip so as to have a wire length such that a delay in said average delay budget is obtained in the gate of each stage.

2. A method according to claim 1, wherein a limitation of said wire length of each stage is calculated from said average delay budget per stage of the gate and delay characteristics of the gate of each stage.

3. A method according to claim 1, wherein when a plurality of paths in each of which a part of the path overlaps calculate different average delay budget, the path having a smaller value is set to the average delay budget.

4. A method according to claim 1, wherein when said average delay budget is equal to or less than a predetermined reference value, it is determined that the logic which has calculated delay budget never achieve the target machine cycle.

5. A method according to claim 4, wherein said predetermined reference value is set to a gate delay.

6. A placement method of electronic parts of a semiconductor integrated circuit, comprising the steps of:
    when gates are placed on a chip, calculating an average delay budget per stage of the gate from a target machine cycle time and the number of stages of the gates of the path;
    calculating a wire length limitation of a net of each stage from said average delay budget and delay characteristics of the gate of each stage; and
    setting said wire length limitation to a target function of the placement.

7. A method according to claim 6, wherein when a plurality of paths in each of which a part of the path overlaps calculate different average delay budget, the path having a smaller value is set to the average delay budget.

8. A method according to claim 6, wherein when said average delay budget is equal to or less than a predetermined reference value, it is determined that the logic which has calculated delay budget never achieve the target machine cycle.

9. A method according to claim 8, wherein said predetermined reference value is set to a gate delay.

10. A placement method of electronic parts of a semiconductor integrated circuit, comprising the steps of:
    when a logic is divided into a plurality of logic blocks and gates are placed on a chip, calculating a virtual wire length of an inter-logic block net;
    calculating a delay between the logic blocks from delay characteristics of source-gate of said inter-logic block net;
    calculating an average delay budget per stage of the gate in the logic block from said delay between the logic blocks, a target machine cycle time, and the number of stages of the gates in the logic block;
    calculating a wire length limitation of the net of each stage from said average delay budget and delay characteristics of the gate of each stage; and
    setting said wire length limitation to a target function of the placement.

11. A method according to claim 10, wherein Din is obtained by the following equation, $$Din = (Tm - Db)/n$$

where,
    Db: said delay between the logic blocks
    Tm: said target machine cycle time
    n: the number of gate stages in said logic block
    Din: said average delay budget per stage of the gate in the logic block.

12. A method according to claim 11, wherein when said average delay budget Din is equal to or less than a predetermined reference value, it is determined that the logic which has calculated delay budget never achieve the target machine cycle.

13. A method according to claim 12, wherein said predetermined reference value is set to a gate delay.

14. A method according to claim 10, wherein a virtual wire length of said inter-logic block net is calculated by setting both ends of said inter-logic block net to center points of the respective logic blocks.

15. A computer readable storage medium in which a program for placing electronic parts by a computer has been recorded, wherein said program comprises the steps of:
    when gates are placed on a chip, calculating an average delay budget per stage of the gate which satisfies a target machine cycle time from the number of stages of the gates of a path; and
    placing said gates so as to have a wire length such that the gate of each stage is set to a delay in said average delay budget.

* * * * *